US012635066B2

(12) United States Patent
Connor et al.

(10) Patent No.: US 12,635,066 B2
(45) Date of Patent: May 19, 2026

(54) THERMALLY DECOUPLED SIGNAL TRANSMISSION LINES

(71) Applicant: International Business Machines Corporation, Armonk, NY (US)

(72) Inventors: Samuel R. Connor, Apex, NC (US); Matthew Doyle, Chatfield, MN (US); Matteo Cocchini, New York, NY (US); Layne A. Berge, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 18/363,934

(22) Filed: Aug. 2, 2023

(65) Prior Publication Data

US 2025/0193996 A1 Jun. 12, 2025

(51) Int. Cl.
*H05K 1/02* (2006.01)
*H04B 5/22* (2024.01)

(52) U.S. Cl.
CPC ............. *H05K 1/0239* (2013.01); *H04B 5/22* (2024.01); *H05K 1/024* (2013.01); *H05K 1/0242* (2013.01); *H05K 2201/062* (2013.01)

(58) Field of Classification Search
CPC .................................................... H05K 1/142
See application file for complete search history.

(56) References Cited

U.S. PATENT DOCUMENTS 5,466,892 A * 11/1995 Howard ............... H05K 1/0239
174/250
5,972,231 A 10/1999 Dibene, II

| | | | |
|---|---|---|---|
| 6,617,509 B1 | 9/2003 | Bergstedt | |
| 7,138,716 B2 | 11/2006 | Burton | |
| 7,535,105 B2 | 5/2009 | Voldman | |
| 8,994,477 B2 | 3/2015 | Wu | |
| 9,491,860 B2 * | 11/2016 | Akahoshi | H01P 5/185 |
| 10,681,842 B1 * | 6/2020 | Hart | H05K 1/0201 |
| 2017/0004923 A1 | 1/2017 | Chen | |

(Continued)

FOREIGN PATENT DOCUMENTS

| | | |
|---|---|---|
| JP | 2009200108 A | 9/2009 |
| WO | 20171743541 W | 10/2017 |

OTHER PUBLICATIONS

Su et al. "AC coupled backplane communication using embedded capacitor", 2008 IEEE-EPEP Electrical Performance of Electronic Packaging, Oct. 27-29, 2008, 4 pages.

(Continued)

*Primary Examiner* — Timothy J Thompson
*Assistant Examiner* — Amol H Patel
(74) *Attorney, Agent, or Firm* — Cantor Colburn LLP; Stosch Sabo

(57) ABSTRACT

A thermally decoupled signal transmission line includes a first segment and a second segment. Each of the first and second segments has an elongated body including a signal conductor, at least one reference plane, and a dielectric interposed between the signal conductor and the at least one reference plane. The first segment and second segments abut at a joint. At the joint, the dielectric in at least one of the first and second segments thermally and electrically insulates the signal conductor in the first segment from the signal conductor in the second segment.

18 Claims, 5 Drawing Sheets

(56) References Cited

U.S. PATENT DOCUMENTS

2020/0106149 A1\* 4/2020 Gumann ................. H01P 1/30

OTHER PUBLICATIONS

Su, B., Pitts, W.S., Franzon, P.D. and Wilson, J., 2010, October. A Zero Power Consumption Multi-Capacitor Structure for Voltage Summing in High-Speed FFE. In 19th Topical Meeting on Electrical Performance of Electronic Packaging and Systems (pp. 13-16). IEEE. See abstract.

\* cited by examiner

THERMALLY DECOUPLED SIGNAL TRANSMISSION LINES

BACKGROUND OF THE INVENTION

This disclosure relates to signal transmission lines and, in particular, to thermally decoupled signal transmission lines.

In quantum computing and other high-performance computing environments, cryogenic temperatures are often required to ensure proper operation and/or to achieve maximum throughput. However, maintaining cryogenic temperatures is complicated by the fact that high-performance computing environments typically include a large number of signal transmission lines for communicating data to and from the compute platform. These signal transmission lines are typically made of copper or a copper alloy, which is both a good electrical and thermal conductor. Because of the thermal conduction capacity of the signal transmission lines, efficiently maintaining a temperature gradient between different "zones" of the compute platform remains challenging.

BRIEF SUMMARY

In at least one embodiment, a thermally decoupled signal transmission line includes a first segment and a second segment. Each of the first and second segments has an elongated body including a signal conductor, at least one reference plane, and a dielectric interposed between the signal conductor and the at least one reference plane. The first segment and second segments abut at a joint. At the joint, the dielectric in at least one of the first and second segments thermally and electrically insulates the signal conductor in the first segment from the signal conductor in the second segment.

DETAILED DESCRIPTION

Figure 1:
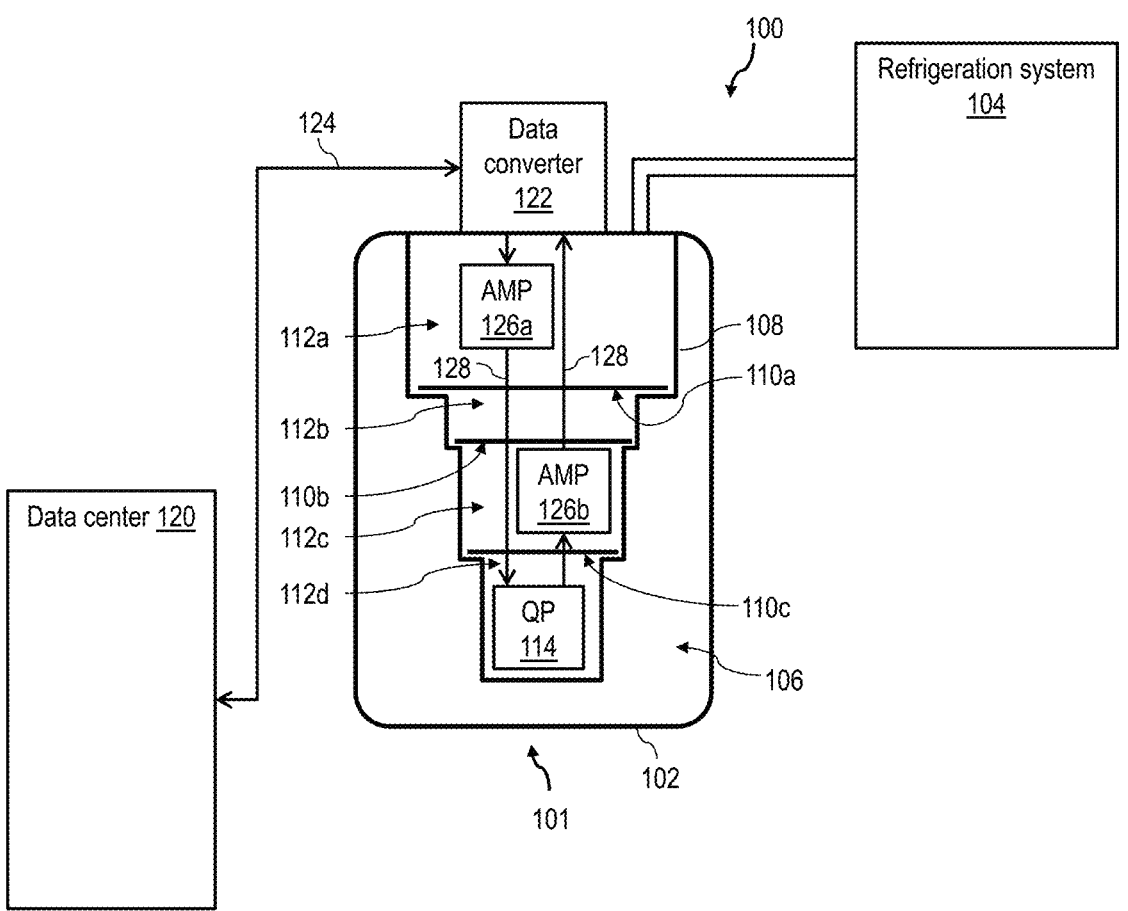
FIG. 1 is a high-level block diagram of an exemplary high-performance computing environment in accordance with one embodiment.

With reference now to the figures and with particular reference to FIG. 1, there is illustrated a high-level block diagram of an exemplary high-performance computing environment 100 in accordance with one embodiment. In this example, high-performance computing environment 100 is illustrated as being a quantum computing environment; of course, in other examples, high-performance computing environment 100 can be a classical computing environment, such as a supercomputer, mainframe, or data center computing environment.

In FIG. 1, high-performance computing environment 100 includes a quantum computer 101. Quantum computer 101 includes an outer temperature control vessel 102, which preferably includes or provides electromagnetic shielding. A refrigeration system 104 preferably maintains interior volume 106 of temperature control vessel 102 at a selected temperature between, for example, 273° K and 325° K. Temperature control vessel 102 houses a vacuum vessel 108 having an interior volume maintained at near vacuum. The interior volume of vacuum vessel 108 is divided by plates or partitions 110a, 110b, and 110c into a plurality of temperature zones 112a, 112b, 112c, and 112d maintained at progressively lower temperatures by refrigeration system 104. For example, temperature zone 112a may be maintained at about 50° K, temperature zone 112b may be maintained at about 25° K, temperature zone 112c may be maintained at about 5° K, and temperature zone 112d may be maintained at a few tenths or hundredths of a degree from absolute zero (e.g., 0.01° K). A quantum processor (QP) 114 disposed in temperature zone 112d performs data processing based on the states of a plurality of qubits.

High-performance computing environment 100 additionally includes a data center 120 that prepares workloads for processing by quantum computer 101 and processes the data output produced by quantum computer 114. Data center 120 is communicatively coupled, via one or more data networks 124, to a data converter 122 associated with quantum computer 101. Data converter 122 converts digital data received from data center 120 via data network 124 into analog format for processing by quantum processor 114 and converts analog data produced by quantum processor 114 into digital data for transmission to data center 120 via data network 124. Quantum computer 101 can additionally include amplifiers 126a, 126b to amplify the analog signals transmitted between data converter 122 and quantum processor 114 via signal transmission lines 128.

Because signal transmission lines 128 span multiple temperature zones within high-performance computing environment, it would be useful and desirable for signal transmission lines 128 to be configured to provide good electrical conductivity while having low thermal conductivity. By limiting the thermal conductivity of signal transmission line 128, heat transfer between temperature zones 112a-112d is reduced, temperature zone 112d can more easily be maintained at a stable temperature, and the energy efficiency of refrigeration system 104 is improved.

Figure 2A:
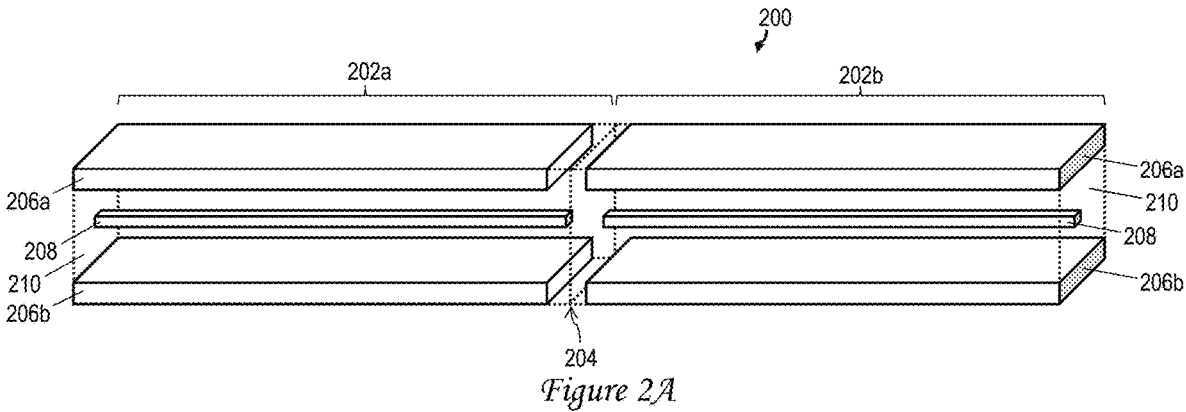
FIGS. 2A-2B depict perspective views of an exemplary embodiment of a thermally decoupled signal transmission line having a butt joint connection.
Figure 2B:
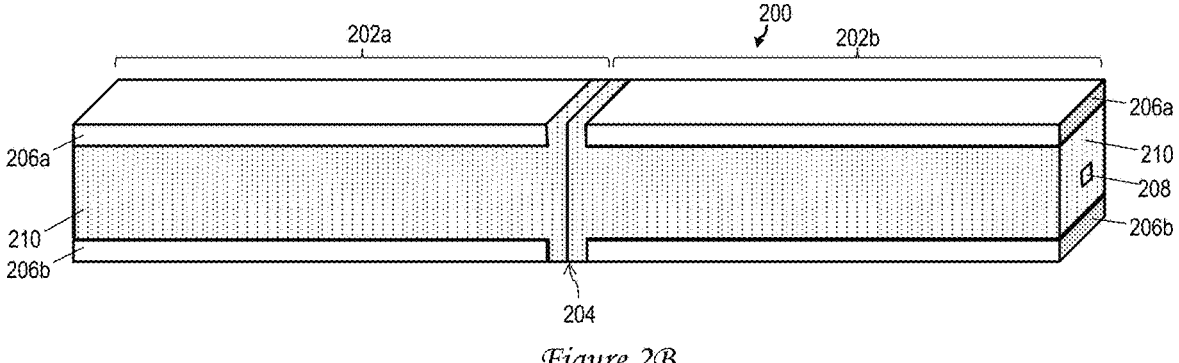

Referring now to FIGS. 2A-2B, there are depicted perspective views of an exemplary embodiment of thermally decoupled signal transmission line 200 having a butt joint connection. FIG. 2A illustrates thermally decoupled signal transmission line 200 with a dielectric transparently illustrated in phantom, while FIG. 2B depicts the same thermally decoupled signal transmission line 200 with the dielectric illustrated as a solid. A signal transmission line 200 can be utilized, for example, to implement any of signal transmission lines 128 in high-performance computing environment 100 of FIG. 1.

Thermally decoupled signal transmission line 200 includes an elongated body having a generally rectilinear cross-section. In other embodiments, thermally decoupled signal transmission line 200 can have a cross-section of a different geometry, such as a circular cross-section. Thermally decoupled signal transmission line 200 is divided into a plurality of shorter elongated portions or segments 202, including segments 202a, 202b, etc. Segments 202 can be, but need not be, of the same length. In the illustrated example, the ends of two segments 202a and 202b abut at an interface 204 to form a butt joint. In some embodiments of high-performance computing environment 100 of FIG. 1, the lengths of segments 202 can be selected such that a butt joint is located at least at each location at which a signal transmission line 128 passes through a partition 110 in order to reduce heat transfer between temperature zones 112.

In the depicted example, each segment 202 includes at least one, and in this embodiment two, reference planes 206, namely, first reference plane 206a and second reference plane 206b. Reference planes 206a, 206b are each maintained at a selected voltage, which may include one or both of alternating current (AC) and direct current (DC) components. Each segment 202 additionally includes a signal conductor 208 spaced apart from reference plane(s) 206. In the embodiment of FIGS. 2A-2B, signal conductor 208 is interposed between and substantially parallel to reference planes 206. In at least some embodiments, signal conductor 208 has a width transverse to the long dimension of signal transmission line 200 that is significantly less than the corresponding dimension of reference plane(s) 206, as shown, for example, in FIGS. 2A-2B. Reference plane(s) 206 and signal conductor 208 can be formed, for example, from a low resistance metallic conductor, such as copper, gold, silver, or an alloy of one or more of these metals.

Each segment 202 additionally includes a dielectric 210 that encapsulates and insulates signal conductor 208 from the reference plane(s) 206 of its segment 202 and from the signal conductor 208 and reference plane(s) 206 of other segments 202. It should particularly be noted that dielectric 210 thermally and electrically isolates reference planes 206 and signal conductor 208 of segment 202a from corresponding reference planes 206 and signal conductor 208 of segment 202b at interface 204. Although not illustrated in FIGS. 2A-2B, in some embodiments, dielectric 210 or another insulator can additionally be utilized to encapsulate and insulate reference plane(s) 206. A high-permittivity material is preferably utilized to implement dielectric 210.

Figures 3A, 3B:
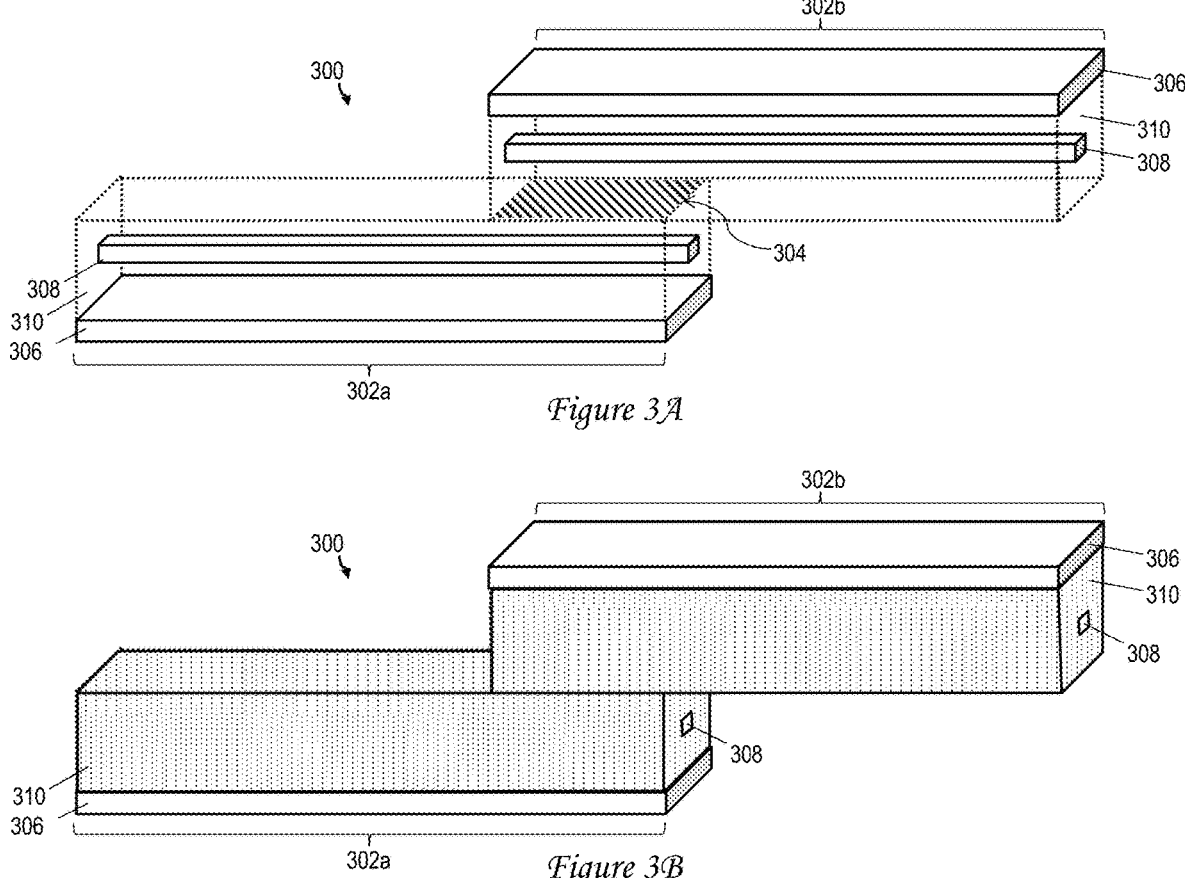
FIGS. 3A-3B illustrate perspective views of an exemplary embodiment of a thermally decoupled signal transmission line having a lap joint connection.

Referring now to FIGS. 3A-3B, there are illustrated perspective views of an exemplary embodiment of a thermally decoupled signal transmission line 300 having a lap joint connection. FIG. 3A illustrates thermally decoupled signal transmission line 300 with a dielectric transparently illustrated in phantom, while FIG. 3B depicts the same thermally decoupled signal transmission line 300 with the dielectric illustrated as a solid. A signal transmission line 300 can be utilized, for example, to implement any of signal transmission lines 128 in high-performance computing environment 100 of FIG. 1.

Thermally decoupled signal transmission line 300 includes an elongated body having a generally rectilinear cross-section. In other embodiments, thermally decoupled signal transmission line 300 can have a cross-section of a different geometry, such as a circular cross-section. Thermally decoupled signal transmission line 300 is divided into a plurality of shorter elongated portions or segments 302, including segments 302a, 302b, etc. Segments 302 can be, but are not required to be, of equal lengths. In the illustrated example, two segments 302a and 302b partially overlap at an interface 304 to form a lap joint. In some embodiments of high-performance computing environment 100 of FIG. 1, the lengths of segments 302 can be selected such that a lap joint is located at least at each location at which a signal transmission line 128 passes through a partition 110 in order to reduce heat transfer between temperature zones 112.

In the depicted example, each segment 302 includes at least one, and in this embodiment only one, reference planes 306 providing a selected DC and/or AC voltage. Each segment 302 additionally includes a signal conductor 308 spaced apart from and generally parallel to reference plane(s) 306. In at least some embodiments, signal conductor 308 has a width transverse to the long dimension of signal transmission line 200 that is significantly less than the corresponding dimension of reference plane(s) 206, as shown, for example, in FIGS. 3A-3B. As above, reference plane(s) 306 and signal conductor 308 can be formed, for example, from a low resistance metallic conductor, such as copper, gold, silver, or an alloy of one or more of these metals.

Each segment 302 additionally includes a dielectric 310 that encapsulates and insulates signal conductor 308 from the reference plane(s) 306 of its segment 302 and from the signal conductor 308 and reference plane(s) 306 of other segments 302. It should particularly be noted that dielectric 310 thermally and electrically isolates reference plane 306 and signal conductor 308 of segment 302a from corresponding reference plane 306 and signal conductor 308 of segment 302b at interface 304. Although not illustrated in FIGS. 3A-3B, in some embodiments, dielectric 310 or another insulator can additionally be utilized to encapsulate and insulate reference plane(s) 306.

Various techniques can be utilized to maintain stable joints between segments 202 or 302 of a thermally decoupled signal transmission line 200 or 300. In some embodiments, stable joints can be promoted by supporting segments 202 or 302 on a common substrate, such as a printed circuit board (PCB) or flex circuit. Alternatively or additionally, the segments 202 or 302 comprising a thermally decoupled signal transmission line 200 or 300 can be bonded to a substrate and/or to each other at interface 204 or 304 by an adhesive, which is preferably selected to have low thermal and electrical conductivity. Alternatively or additionally, the segments 202 or 302 comprising a thermally decoupled signal transmission line 200 or 300 can be maintained in fixed relation to one another through the use of magnets (e.g., permanent magnets) that align and hold magnetic reference planes 206 or 306 in a desired physical configuration.

Figures 4A, 4B:
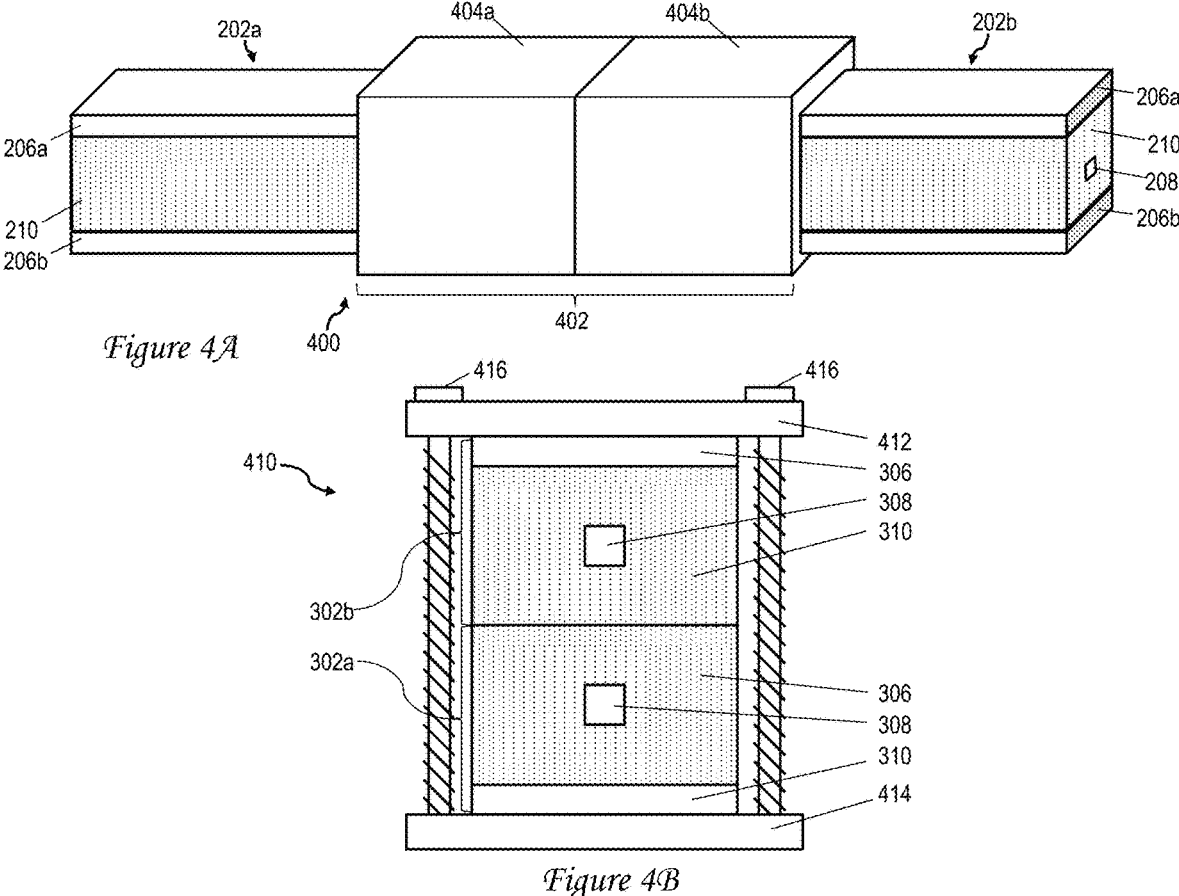
FIGS. 4A-4B depict two examples of mechanical fixtures that can be utilized to maintain joints between segments of a thermally decoupled signal transmission line in accordance with some embodiments.

In some embodiments, the stability of joints between segments 202 or 302 can alternatively or additionally be promoted through the use of one or more mechanical fixtures. For example, in some embodiments, the mechanical fixture(s) can include screws through non-conductive portions of segments 202 or 302 that affix the segments 202 or 302 to a substrate, such as a PCB. FIGS. 4A-4B depict two additional examples of mechanical fixtures that can be utilized to maintain joints between segments of a thermally decoupled signal transmission line in accordance with some embodiments. Specifically, FIG. 4A illustrates use of a connector, and FIG. 4B depicts use of a clamp.

FIG. 4A depicts a perspective view of a thermally decoupled signal transmission line 400 including a butt joint between segments 202a and 202b as previously illustrated in FIGS. 2A-2B. The butt joint is supported by a connector 402 including a first portion 404a rigidly affixed to segment 202a and a second portion 404b rigidly affixed to segment 202b. First and second portions 404a, 404b can be releasably connected to each other, for example, by snap-fit connectors, screws, etc., in order to maintain segments 202a and 202b in fixed relation.

FIG. 4B illustrates a section view of thermally decoupled signal transmission line 410 including a lap joint between segments 302a and 302b as previously described with reference to FIGS. 3A-3B. In this case, the lap joint is supported by a clamp including a first plate 412, a second plate 414, and one or more fasteners, such as screws 416. In some embodiments, one of first plate 412 or second plate 414 can be a PCB. In use, the lap joint between segments 302*a* and 302*b* is assembled, and screws 416 are tightened to releasably retain the lap joint within the clamp and maintain segments 202*a* and 202*b* in fixed relation.

Figure 5:
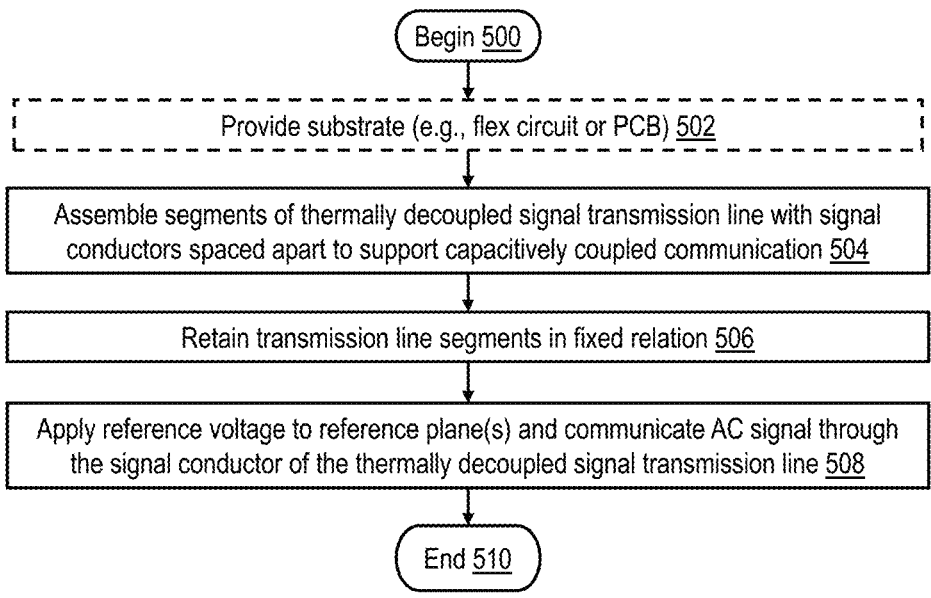
FIG. 5 is a high-level logical flowchart of an exemplary process for making and using a thermally decoupled signal transmission line in accordance with one embodiment.

With reference now to FIG. 5, there is illustrated a high-level logical flowchart of an exemplary process for making and using a thermally decoupled signal transmission line in accordance with one embodiment. The process begins at block 500 and then proceeds to optional block 502, which illustrates optionally providing a substrate for a thermally decoupled signal transmission line, such as a flex circuit or a PCB. The process proceeds from block 502 to block 504, which illustrates assembling segments of a thermally decoupled signal transmission line. In embodiments in which a substrate is provided at block 502, at least some of the segments assembled at block 504 are preferably supported by the substrate.

As illustrated above with reference to FIGS. 2A-2B and 3A-3B, the segments are assembled with the signal conductors 208 or 308 spaced apart to support capacitively coupled communication of signals via the signal conductors 208 or 308 of the thermally decoupled signal transmission lines. Capacitive coupling provides thermal isolation, enabling elimination of attenuators or similar devices that are used to reduce thermal coupling between thermal zones of a high-performance computing environment. In addition, capacitive coupling supports signal communication without the use of exotic conductive materials that are less thermally conductive (e.g. CuNi) but come with a large electrical attenuation penalty. As a result, thermally decoupled signal communication lines can be fabricated with a lower material cost, and signal transmission can be achieved with less amplification and power usage, reducing power dissipation and heat generation. Capacitive signal coupling also acts as a high-pass filter, reducing or eliminating propagation of low-frequency noise (e.g., from power supplies, fan controllers, etc.) via the thermally decoupled signal transmission lines. It should also be noted that return planes 206 or 306 of the segments of the thermally decoupled signal transmission line are also capacitive coupled, providing a return for the electromagnetic field and resulting in an improvement in the overall signal quality of the thermally decoupled signal transmission line.

As a part of the assembly of the segments of the thermally decoupled signal transmission line at block 504 or as additional step depicted at block 506, the various segments of the thermally decoupled signal transmission line are retained in fixed relation using one or more techniques described above (e.g., using a connector, adhesive, magnets, mechanical fixture, etc.). Following block 506, a reference voltage is applied to the reference plane(s) 206 or 306 of the thermally decoupled signal transmission line and an AC signal is capacitively communicated between the segments of the thermally decoupled signal transmission line (block 508). In at least some embodiments, the frequency of the AC signal is in the tens of MHz or higher, which is high enough that the capacitive impedance does not block signal transmission. Thereafter, the process of FIG. 5 ends at block 510.

As has been described, a thermally decoupled signal transmission line includes a first segment and a second segment. Each of the first and second segments has an elongated body including a signal conductor, at least one reference plane, and a dielectric interposed between the signal conductor and the at least one reference plane. The first segment and second segments abut at a joint. At the joint, the dielectric in at least one of the first and second segments thermally and electrically insulates the signal conductor in the first segment from the signal conductor in the second segment.

While various embodiments have been particularly shown and described, it will be understood by those skilled in the art that various changes in form and detail may be made therein without departing from the spirit and scope of the appended claims and these alternate implementations all fall within the scope of the appended claims. For example, those skilled in the art should appreciate that the capacitive coupling between abutting segments of the thermally decoupled signal transmission lines can be tuned through use of a high permittivity dielectric and/or with changes in the geometry of the joints. For example, in some embodiments, the capacitance between the abutting surfaces can be increased by reducing the distance between signal conductors at the abutting surfaces or by increasing the coupled surface area through enlargement of the ends of the conductors or implementation of more advanced conductor shapes (e.g., inter-digitation of the conductors of abutting segments).

The figures described herein and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms and that features of different disclosed embodiments can be combined. Lastly, the use of a singular term, such as, but not limited to, "a" is not intended as limiting of the number of items.

What is claimed is:

1. A thermally decoupled signal transmission line, comprising:

a first segment and a second segment, wherein:

each of the first and second segments has an elongated body including a signal conductor, at least one reference plane, and a dielectric interposed between the signal conductor and the at least one reference plane;

the first segment and second segments abut at a joint; and the dielectric in at least one of the first and second segments thermally and electrically insulates the signal conductor in the first segment from the signal conductor in the second segment.

2. The thermally decoupled signal transmission line of claim 1, wherein each of the first and second segments includes multiple reference planes.

3. The thermally decoupled signal transmission line of claim 1, wherein the dielectric is a high-permittivity dielectric.

4. The thermally decoupled signal transmission line of claim 1, wherein the joint comprises a butt joint.

5. The thermally decoupled signal transmission line of claim 1, wherein the joint comprises a lap joint.

6. The thermally decoupled signal transmission line of claim 1, further comprising a mechanical fixture that retains the first and second segments in fixed relation.

7. The thermally decoupled signal transmission line of claim 6, wherein the mechanical fixture includes at least one of a connector and a clamp.

8. A high-performance computing environment, comprising:

an enclosure including a plurality of temperature zones;

a processor disposed in one of the plurality of temperature zones; and a thermally decoupled signal transmission line in accordance with claim 1, wherein the thermally decoupled signal transmission line is coupled to the processor and spans at least two of the temperature zones.

9. The high-performance computing environment of claim 8, wherein the processor comprises a quantum processor.

10. A method, comprising:

providing a first segment and a second segment of a thermally decoupled signal transmission line, wherein each of the first and second segments has an elongated body including a signal conductor, at least one reference plane, and a dielectric interposed between the signal conductor and the at least one reference plane;

assembling the first segment and second segments to abut at a joint, such that the dielectric in at least one of the first and second segments thermally and electrically insulates the signal conductor in the first segment from the signal conductor in the second segment; and retaining the first and second segments in fixed relation.

11. The method of claim 10, wherein the providing includes providing first and second segments each including multiple reference planes.

12. The method of claim 10, wherein the dielectric is a high-permittivity dielectric.

13. The method of claim 10, wherein the assembling includes assembling the first and second segments in a butt joint.

14. The method of claim 10, wherein the assembling includes assembling the first and second segments in a lap joint.

15. The method of claim 10, wherein the retaining includes retaining the first and second segments in fixed relation with a mechanical fixture.

16. The method of claim 15, wherein the mechanical fixture includes at least one of a connector and a clamp.

17. The method of claim 10, further coupling the thermally decoupled signal transmission line to a processor of a high-performance computer including an enclosure having a plurality of temperature zones such that the thermally decoupled signal transmission line spans at least two of the temperature zones.

18. The method of claim 17, wherein the coupling includes coupling the thermally decoupled signal transmission line to a quantum processor.

\*    \*    \*    \*    \*